US011047822B2

(12) United States Patent
Nakano et al.

(10) Patent No.: US 11,047,822 B2
(45) Date of Patent: Jun. 29, 2021

(54) SENSOR DEVICE

(71) Applicant: HITACHI AUTOMOTIVE SYSTEMS, LTD., Ibaraki (JP)

(72) Inventors: Hiroshi Nakano, Tokyo (JP); Masahiro Matsumoto, Tokyo (JP); Yasuo Onose, Hitachinaka (JP); Hiroaki Hoshika, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 349 days.

(21) Appl. No.: 16/325,593

(22) PCT Filed: Jul. 4, 2017

(86) PCT No.: PCT/JP2017/024425
§ 371 (c)(1),
(2) Date: Feb. 14, 2019

(87) PCT Pub. No.: WO2018/037719
PCT Pub. Date: Mar. 1, 2018

(65) Prior Publication Data
US 2019/0204251 A1 Jul. 4, 2019

(30) Foreign Application Priority Data

Aug. 22, 2016 (JP) .............................. JP2016-161626

(51) Int. Cl.
*G01N 27/04* (2006.01)
*H01C 1/16* (2006.01)
(Continued)

(52) U.S. Cl.
CPC ............. *G01N 27/046* (2013.01); *G01F 1/68* (2013.01); *G01N 27/18* (2013.01); *H01C 1/16* (2013.01);
(Continued)

(58) Field of Classification Search
CPC ........ G01N 27/046; H01C 1/16; H01C 7/021; H01C 7/041
See application file for complete search history.

(56) References Cited

U.S. PATENT DOCUMENTS 3,728,702 A * 4/1973 Miyamoto ............. G01K 3/005
340/595
4,702,619 A * 10/1987 Camp ..................... G01K 7/22
374/144
(Continued)

FOREIGN PATENT DOCUMENTS

JP 60-082949 A 5/1985
JP 2015-050549 A 3/2015

OTHER PUBLICATIONS

International Search Report for PCT/JP2017/024425, dated Sep. 5, 2017.

*Primary Examiner* — Kyung S Lee
(74) *Attorney, Agent, or Firm* — Volpe Koenig

(57) ABSTRACT

A sensor device includes a detection resistor having a resistance value changing according to a physical quantity and a reference resistor compared with the detection resistor, the reference resistor is configured by electrically connecting a first resistance circuit and a second resistance circuit. The first resistance circuit includes a first and a second resistive element having positive and negative resistance temperature coefficients, respectively, which are electrically connected. The second resistance circuit includes a third and a fourth resistive elements having a positive and a negative resistance temperature coefficient, respectively, which are electrically connected. The first resistance circuit is configured to generate a first deviation to either the positive or negative side with respect to a temperature change, and the second resistance circuit is configured to generate a second (Continued)

deviation to the side opposite to the positive or negative side where the first deviation is generated.

6 Claims, 9 Drawing Sheets

(51) Int. Cl.
  *H01C 7/02* (2006.01)
  *H01C 7/04* (2006.01)
  *G01N 27/18* (2006.01)
  *G01F 1/68* (2006.01)
  *H01L 27/04* (2006.01)
  *H01L 21/822* (2006.01)

(52) U.S. Cl.
  CPC .............. *H01C 7/021* (2013.01); *H01C 7/041* (2013.01); *H01L 21/822* (2013.01); *H01L 27/04* (2013.01)

(56) References Cited

U.S. PATENT DOCUMENTS

| | | | |
|---|---|---|---|
| 5,345,184 A | 9/1994 | Andoh | |
| 5,748,429 A * | 5/1998 | Peterson | G01K 15/00 219/484 |
| 6,824,308 B2 * | 11/2004 | Sumimoto | G01K 15/00 374/1 |
| 6,888,763 B1 * | 5/2005 | Guo | G11C 5/145 331/175 |
| 7,217,981 B2 * | 5/2007 | Coolbaugh | H01L 28/20 257/380 |
| 2015/0059467 A1 | 3/2015 | Enomoto | |

\* cited by examiner

*FIG.* 4 - PRIOR ART
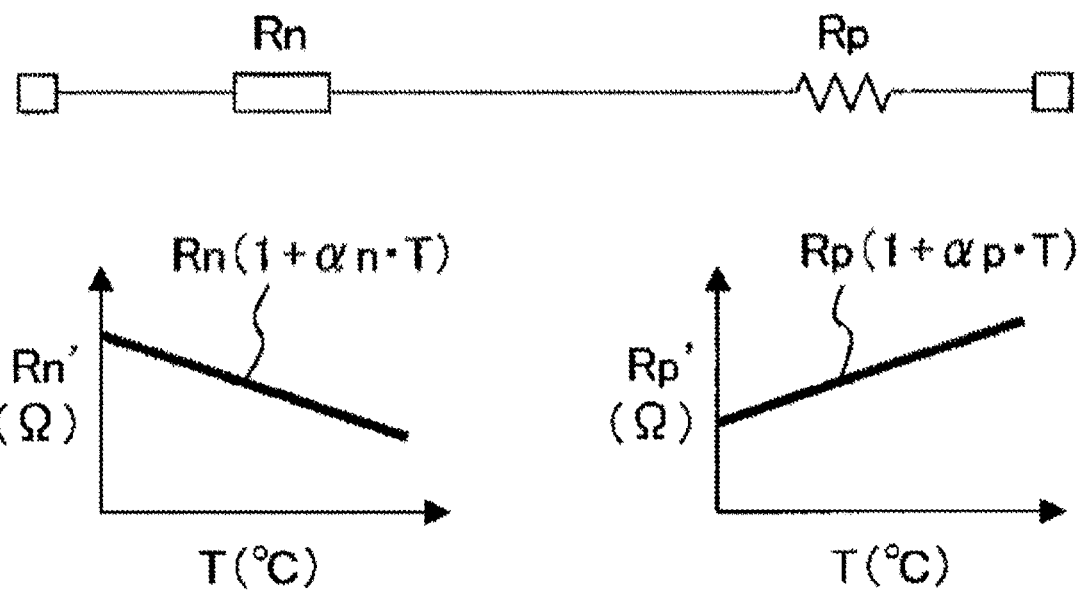
*FIG.* 5
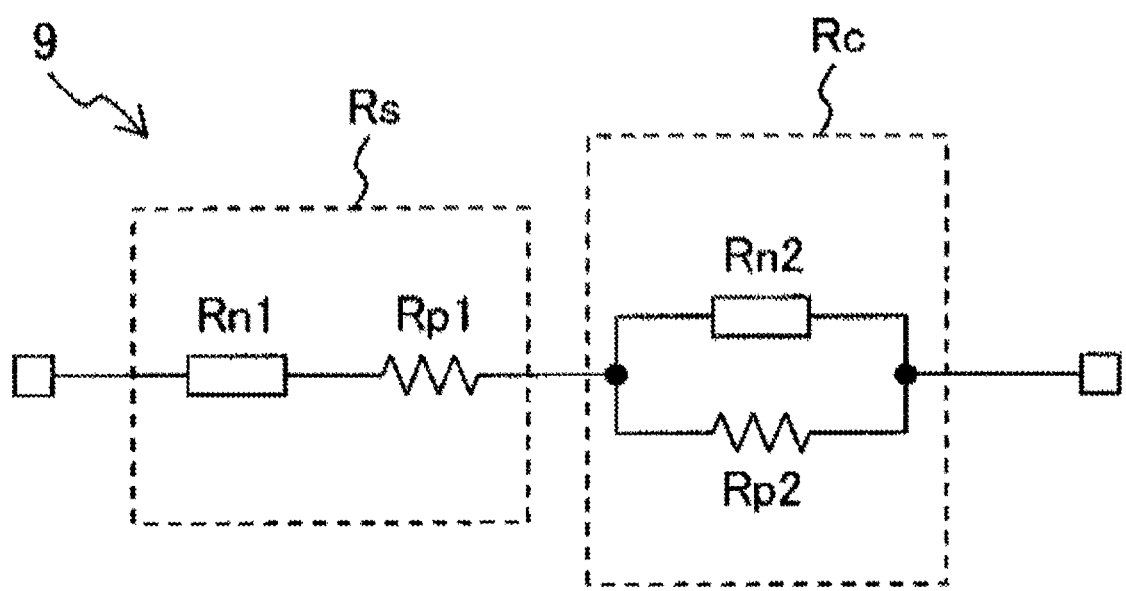

SENSOR DEVICE

TECHNICAL FIELD

The present invention relates to a sensor device including a resistance circuit and, particularly, to a sensor device including a resistance circuit capable of reducing temperature dependence of a resistance value.

BACKGROUND ART

Recently, the integration of a sensor device progresses to meet the requirement for miniaturization of the sensor device. For example, as a sensor device used in an internal combustion engine for a vehicle, a multifunctional sensor device capable of measuring a plurality of environment parameters from environment parameters such as a flow rate, humidity, a pressure, and a temperature of intake air is required. To integrate a plurality of sensor elements for measuring these environment parameters and circuit components such as LSI, it is necessary to miniaturize the sensor elements and the circuit components and reduce the number of components.

As an example of the sensor device, there is a sensor device using a bridge circuit using a reference resistor in a drive circuit of a sensor element. The reference resistor is required to have a small change in resistance value with temperature. Conventionally, a highly accurate resistor is used as the reference resistor or a resistance value of a resistor is adjusted by resistor trimming. However, in this case, an issue of an increase in component cost or securing an installation space must be dealt with. On the other hand, the reference resistor to be an alternative to a chip resistor is formed in the LSI, so that the number of components can be reduced. However, there is a problem in that a change in resistance value with temperature (hereinafter, referred to as the resistance change with temperature) is large in a resistance element capable of being formed in the LSI. If there is the resistance change with temperature in the reference resistor of the drive circuit of the sensor element, a measurement error occurs due to the temperature change of the sensor device. Particularly, in the reference resistor used in the bridge circuit of the sensor element, it is necessary to reduce the temperature dependency to accurately detect a minute resistance change of the sensor element regardless of the temperature change of the sensor device.

JP 2015-50549 A (PTL 1) discloses a technology for reducing temperature dependency of an oscillation frequency of an oscillation circuit used in a sensor device. The sensor device includes a semiconductor chip to adjust and output a sensor signal, and the semiconductor chip includes an oscillation circuit to give an oscillation frequency to an A/D converter, a digital operation unit, and a D/A converter. A resistor for controlling the oscillation frequency in the oscillation circuit is provided by combining a positive temperature coefficient resistor and a negative temperature coefficient resistor. Specifically, a plurality of semiconductor resistors having positive temperature coefficients and a plurality of contact resistors having negative temperature coefficients are combined, numbers and a ratio of numbers of semiconductor resistors and contact resistors used are adjusted, and a temperature characteristic of the entire resistor is flattened (refer to Abstract). More specifically, the semiconductor resistors and the contact resistors are connected by serial connection, parallel connection, or a combination of the serial connection and the parallel connection (refer to paragraph 0022).

CITATION LIST

Patent Literature

PTL 1: JP 2015-50549 A

SUMMARY OF INVENTION

Technical Problem

For example, in a gas sensor device that measures an environment parameter (physical quantity) in an intake passage of an internal combustion engine, a temperature range of an environment in which the sensor device is placed is wide due to a change in travelling environment or engine heat generation. Thus, it is necessary to satisfy sensor performance requirements at $-40°$ C. to $+125°$ C. For this reason, the temperature change of the resistor increases and a resistor having a small resistance change with temperature in a wide range of temperature environment is required. In addition, when it is used as a reference resistor of a bridge circuit to detect a resistance change of a sensor element, a minute resistance change of the reference resistor affects measurement accuracy. For this reason, a resistor having a small resistance change with temperature is required.

The resistor disclosed in PTL 1 uses the semiconductor resistor made of a resistive material having a positive temperature coefficient and the contact resistor made of a resistive material having a negative temperature coefficient, thereby offsetting a resistance change with temperature generated in the semiconductor resistor and a resistance change with temperature generated in the contact resistor. To increase an offset effect, the resistance value of the semiconductor resistor and the resistance value of the contact resistor need to have an optimum ratio. In the resistor disclosed in PTL 1, the ratio between the number of semiconductor resistors and the number of contact resistors is previously adjusted to flatten the temperature characteristic.

However, because a variation occurs in each resistance value due to a manufacturing variation, the ratio between the resistance value of the semiconductor resistor and the resistance value of the contact resistor does not become a design ratio. If a variation occurs in the ratio between the resistance values, the resistance change with temperature of any one of the resistors increases and the offset effect is lowered. For example, when the resistor having the positive temperature coefficient is manufactured with a resistance value larger than a design value, the positive temperature coefficient is generated in an overall combined resistance. Conversely, if the resistor having the negative temperature coefficient is manufactured with a resistance value larger than the design value, the negative temperature coefficient is generated in the overall combined resistance.

Therefore, if two kinds of resistive materials are combined, a variation of a balance of two kinds of resistance values is caused and, consequently, positive or negative random resistance temperature coefficient is generated in the combined resistance of the resistor. The resistance temperature coefficient generated in the resistor changes the characteristic of the sensor device and affects the measurement accuracy of the sensor device.

An object of the present invention is to provide a sensor device capable of reducing a characteristic change caused by a temperature change.

Solution to Problem

To achieve the above object, a sensor device according to the present invention includes a detection resistor having a resistance value changing according to a physical quantity and a reference resistor compared with the detection resistor and that measures the physical quantity on the basis of a change in the resistance value of the detection resistor. The reference resistor is configured by electrically connecting a first resistance circuit and a second resistance circuit. The first resistance circuit includes a first resistive element having a positive resistance temperature coefficient and a second resistive element having a negative resistance temperature coefficient that are electrically connected, and the second resistance circuit includes a third resistive element having a positive resistance temperature coefficient and a fourth resistive element having a negative resistance temperature coefficient that are electrically connected. The first resistance circuit is configured such that a combined resistance value generates a first deviation to either the positive or negative side with respect to a temperature change. The second resistance circuit is configured such that a combined resistance value generates a second deviation to the side opposite to the positive or negative side where the first deviation is generated, with respect to the temperature change.

Advantageous Effects of Invention

According to the present invention, it is possible to provide a highly accurate sensor device that can reduce a characteristic change of the sensor device caused by a temperature change and is hardly affected by the temperature change. Problems, configurations, and effects other than those described above will be apparent from the following description of embodiments.

BRIEF DESCRIPTION OF DRAWINGS

FIG. 4 is a resistance circuit diagram showing a configuration according to a comparative example of the present invention.

FIG. 5 is a resistance circuit diagram of a sensor device according to an embodiment of the present invention.

DESCRIPTION OF EMBODIMENTS

In an embodiment to be described below, the present invention is applied to a gas concentration sensor device for measuring intake air humidity of a vehicle engine as an example of a sensor device. A physical quantity (environment parameter) to be detected by the sensor device according to the embodiment is a gas concentration change, and the sensor device can also be used for measuring a hydrogen concentration and the like, for example.

The intake air humidity to be measured by the sensor device according to the embodiment is measured by detecting a change in thermal conductivity of the gas due to the concentration of the gas. The change in thermal conductivity is detected from a change in a radiation amount of a heater formed in a sensor element. Since the change in thermal conductivity of the gas due to the concentration of the gas is minute, a highly accurate drive circuit is required for detecting the change in the radiation amount of the heater and controlling a temperature of the heater, and an effect according to a configuration of the present invention is high in this sensor device.

First Embodiment

Figure 1:
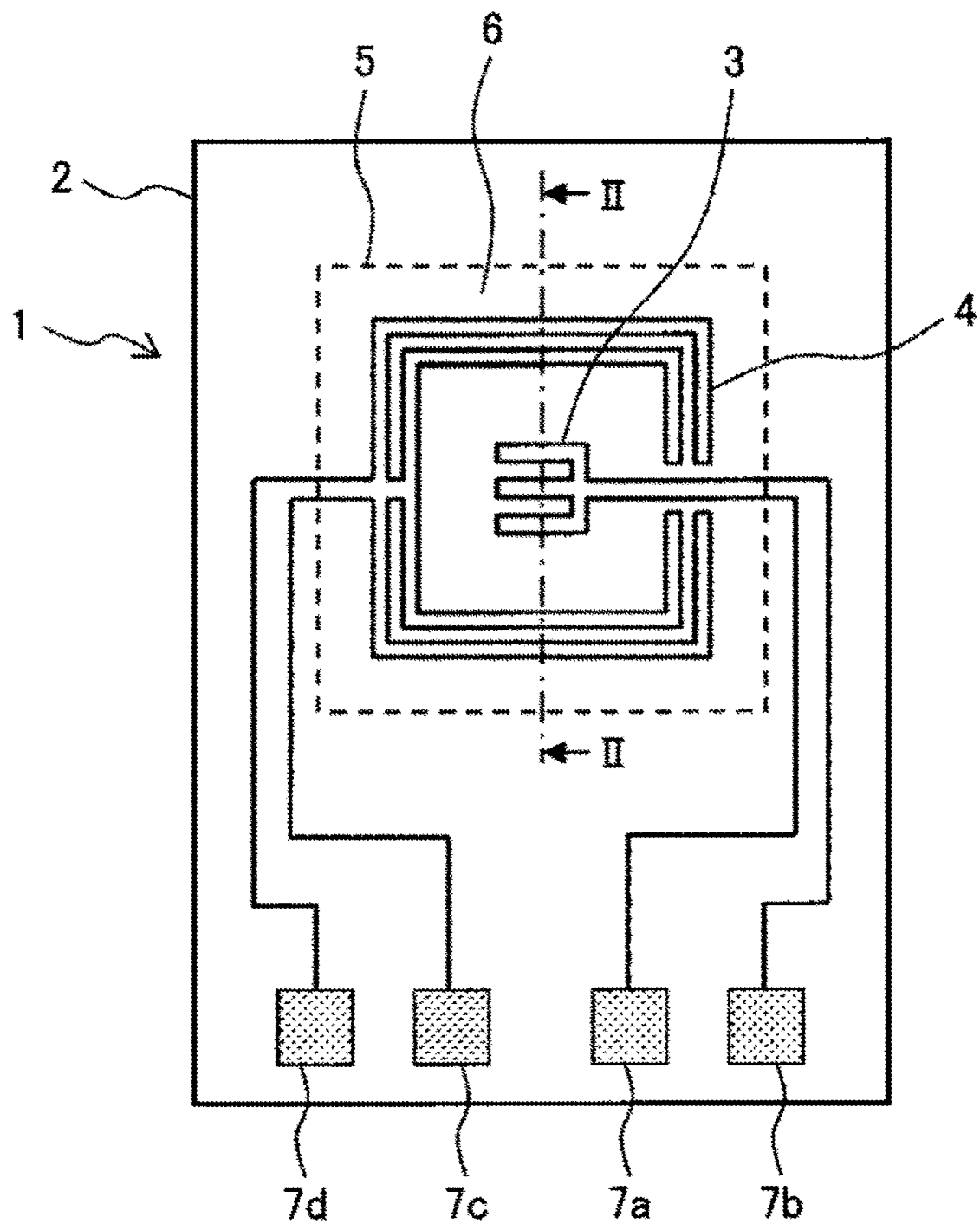
FIG. 1 is a plan view of a sensor element according to an embodiment of the present invention.

FIG. 1 shows a plan view of a sensor element 1 of a gas concentration sensor device in this embodiment.

The sensor element 1 has a substrate 2 formed of single crystal silicon. A cavity portion 5 is formed in the substrate 2 and the cavity portion 5 is covered by a thin film support 6. A detection heater 3 and a compensation heater 4 are laid on the thin film support 6. The compensation heater 4 is disposed to surround the detection heater 3. The detection heater 3 and the compensation heater 4 extend along a plane of the thin film support 6 and are formed as resistance patterns having a plurality of folded portions. The detection heater 3 and the compensation heater 4 include electrodes 7a, 7b, 7c, and 7d formed on the substrate 2 for connection with a drive circuit 30 (refer to FIG. 3).

Figure 2:
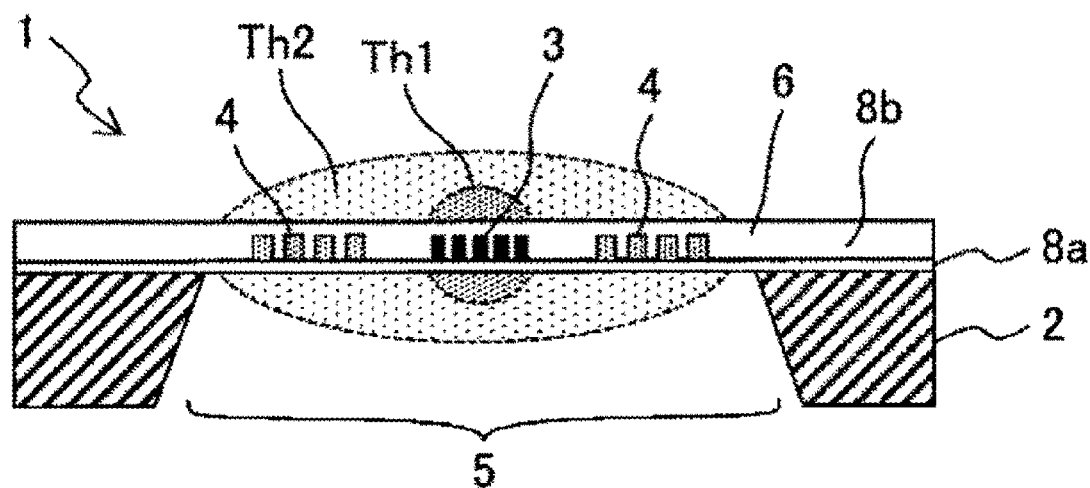
FIG. 2 is a cross-sectional view of the sensor element shown in FIG. 1.

FIG. 2 is a diagram showing a cross-section taken along the line II-II of FIG. 1.

The sensor element 1 includes the substrate 2 formed of single crystal silicon. The substrate 2 includes the cavity portion 5. The thin film support 6 is stacked on a top surface of the substrate 2. The thin film support 6 includes insulating layers 8a and 8b and is provided such that the detection heater and the compensation heater 4 are interposed between the insulating layer 8a and the insulating layer 8b. The detection heater 3 and the compensation heater 4 are supported by the insulating layers 8a and 8b.

An operation of the sensor element 1 will be described using FIG. 2.

The detection heater 3 is held at a temperature Th1 by controlling a current flowing through the detection heater 3. In addition, the compensation heater 4 is held at a temperature Th2 by controlling a current flowing through the compensation heater 4. For example, the temperature Th1 is about 500° C. and the temperature Th2 is about 300° C. if a concentration of gas in an atmosphere in which the sensor element 1 is placed changes, thermal conductivity of the gas changes and a radiation amount of the detection heater 3 changes. The concentration of the gas is detected from the change in the radiation amount.

Although a temperature of an environment in which the sensor element 1 is installed changes according to a travelling environment of a vehicle or an operating state of an engine, a peripheral portion of the detection heater 3 is held at a constant temperature higher than the environment temperature by using the compensation heater 4, so that an influence of an environment temperature change is eliminated. As a result, it is possible to directly detect humidity from the change in the radiation amount of the detection heater 3.

For the detection heater 3 and the compensation heater 4 for example, platinum (Pt), tantalum (Ta), molybdenum (Mo), or silicon (Si) is selected as a material stable at high temperatures (a material having a high melting point), and silicon oxide (SiO2) and silicon nitride (Si3N4) are selected in a single-layered configuration or a stacked configuration as the insulating layers 8a and 8b. As the insulating layers 8a and 8b, a resin material such as polyimide, ceramic, or glass can be selected in the single-layered configuration or the stacked configuration. In addition, aluminum (Al) or the like is selected as the electrodes 7a, 7b, 7c, and 7d.

The sensor element 1 is formed using a semiconductor microfabrication technique or an anisotropic etching technique using photolithography. The cavity portion 5 is formed by processing the single crystal silicon substrate 2 using anisotropic etching or isotropic etching.

Figure 3:
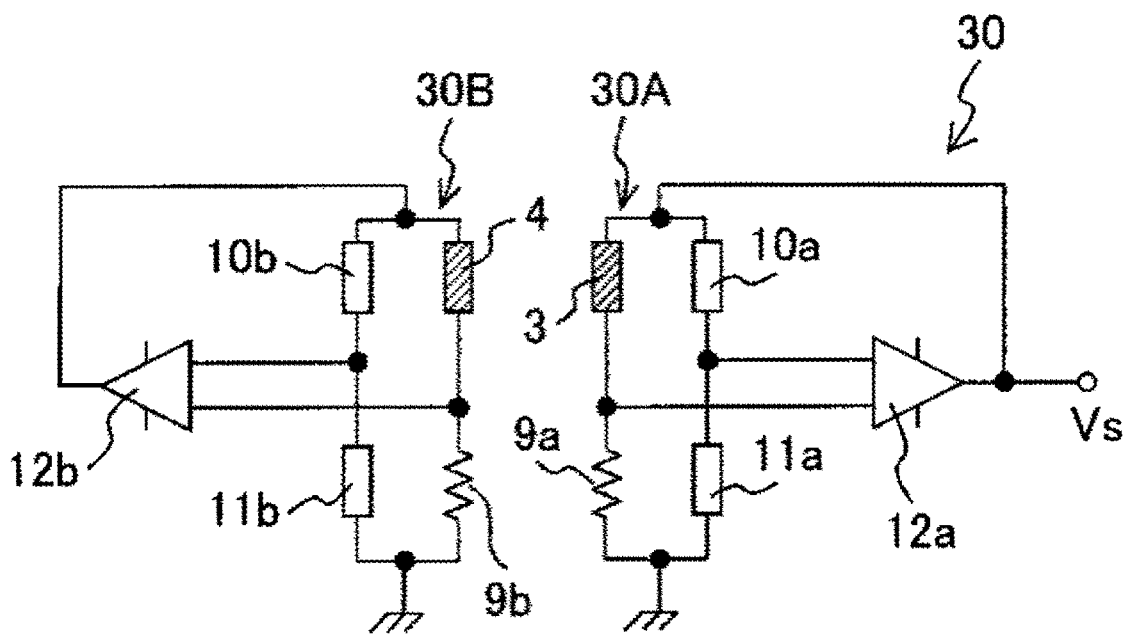
FIG. 3 is a drive circuit diagram of a sensor element according to an embodiment of the present invention.

FIG. 3 shows a drive circuit of the gas concentration sensor device in the embodiment.

The sensor device according to embodiment is configured to include the sensor element 1 shown in FIG. 1 and the drive circuit 30 shown in FIG. 3. The drive circuit 30 includes a bridge circuit 30A for controlling heating of the detection heater 3 and a bridge circuit 30B for controlling heating of the compensation heater 4.

The bridge circuit 30A including the detection heater 3 includes a series circuit in which a reference resistor 9a is electrically connected in series to the detection heater 3 (first series circuit) and a series circuit in which a resistor 10a and a resistor 11a are electrically connected in series to each other (second series circuit). A potential of a connection portion between detection heater 3 and the reference resistor 9a (first potential) and a potential of a connection portion between the resistor 10a and the resistor 11a (second potential) are input to a differential amplifier 12a. The differential amplifier 12a outputs a voltage or a current according to a difference between the input voltages (a difference voltage between the first potential and the second potential). An output of the differential amplifier 12a is connected between the detection heater 3 and the resistor 10a of the bridge circuit 30A and is fed back as a heating current of the detection heater 3.

A resistance value of each of the resistor 10a and the resistor 11a is set to 10 times or more of a resistance value of the detection heater 3. As a result, most of the current supplied from the differential amplifier 12a flows to detection heater 3 and the detection heater 3 can be efficiently heated.

Since the resistance value of the detection heater 3 changes with the temperature, the detection heater 3 can be held at a constant temperature by performing feedback control such that a resistance ratio between the detection heater 3 and the reference resistor 9a becomes constant.

The bridge circuit 30B including the compensation heater 4 includes a series circuit in which a reference resistor 9b is electrically connected in series to the compensation heater 4 (third series circuit) and a series circuit in which a resistor 10b and a resistor 11b are electrically connected in series to each other (fourth series circuit). A potential of a connection portion between the compensation heater 4 and the reference resistor 9b (third potential) and a potential of a connection portion between the resistor 10ab and the resistor 11b (fourth potential) are input to a differential amplifier 12b. The differential amplifier 12b outputs a voltage or a current according to a difference between the input voltages (a difference voltage between the third potential and the fourth potential). An output of the differential amplifier 12b is connected between the compensation heater 4 and the resistor 10b of the bridge circuit 30B and is fed back as a heating current of the compensation heater 4.

A resistance value of each of the resistor 10b and the resistor 11b is set to 10 times or more of the resistance value of the compensation heater 4. As a result, most of the current supplied from the differential amplifier 12b flows to the compensation heater 4 and the compensation heater 4 can be efficiently heated.

Since the resistance value of the compensation heater 4 changes with the temperature, the compensation heater 4 can be held at a constant temperature by performing feedback control such that a resistance ratio between the compensation heater 4 and the reference resistor 9b becomes constant.

The reference resistors 9a and 9b, the resistors 10a and 10b, the resistors 11a and 11b, and the differential amplifier circuits 12a and 12b are provided to be integrated into a semiconductor chip.

A ratio between the resistance value of the resistor 10a and the resistance value of the resistor 11a needs to be constant. In addition, a ratio between the resistance value of the resistor 10b and the resistance value of the resistor 11b needs to be constant. For this purpose, the resistor 10a and the resistor 11a are formed in the semiconductor chip by using the same material and the same process. In addition, resistor 10b and the resistor 11b are formed in the semiconductor chip by using the same material and the same process. In this way, even when a resistance change with temperature is generated in the resistors 10a and 11a and the resistors 10b and 11b, resistance change rates of the resistor 10a and the resistor 11a are matched with each other and resistance change rates of the resistor 10b and the resistor 11b are matched with each other. Accordingly, the ratio between the resistance value of the resistor 10a and the resistance value of the resistor 11a and the ratio between the resistance value of the resistor 10a and the resistance value of the resistor 11a are constantly maintained.

The drive circuit 30 operates such that the ratio between the resistance value of the reference resistor 9a and the resistance value of the detection heater 3 at the time of heating (at the time of driving) becomes constant. In this case, if the resistance value of the reference resistor 9a changes with an environment temperature, the temperature of the detection heater 3 changes such that the resistance ratio between the detection heater 3 and the reference resistor 9a becomes constant. If the temperature of the detection heater 3 changes, heating power changes and a measurement error occurs. In addition, the drive circuit 30 operates such that the ratio between the resistance value of the reference resistor 9b and the resistance value of the compensation heater 4 at the time of heating (at the time of driving) becomes constant. For this reason, if the resistance value of the reference resistor 9b changes with the environment temperature, the temperature of the compensation heater 4 changes such that the resistance ratio between the compensation heater 4 and the reference resistor 9b becomes constant. Therefore, the reference resistors 9a and 9b are required to have a small resistance change with temperature caused by the environment temperature.

FIG. 4 shows a configuration of a resistance circuit according to a comparative example of the present invention.

In the comparative example of FIG. 4, when the reference resistors 9a and 9b are formed in the semiconductor chip, a resistor Rp made of a resistive material having a positive resistance temperature coefficient and a resistor Rn made of a resistive material having a negative resistance temperature coefficient are connected to form a series circuit. When the resistance temperature coefficient of the resistor Rp is set to αp and the resistance temperature coefficient of the resistor Rn is set to −αn, a combined resistance Rs of the resistor Rn and the resistor Rp becomes $$Rs = Rp(1+\alpha p \cdot T) + Rn(1-\alpha n \cdot T) = (Rp+Rn)(1+(Rp\alpha p - Rn\alpha n)/(Rp+Rn) \cdot T \qquad (1).$$

To cause a coefficient of a temperature T to become zero in Formula (1), $$Rp/Rn = \alpha n/\alpha p \qquad (2)$$

is set. By appropriately designing a ratio between the resistor Rp and the resistor Rn according to the resistance temperature coefficients αn and αp, an effect of offsetting temperature dependence is obtained.

However, since the resistor Rp and the resistor Rn are formed of different materials, manufacturing processes are also different and variations irrelevant to each other occur in a resistance value (Rp) of the resistor Rp and a resistance value (Rn) of the resistor Rn. Therefore, a resistance temperature coefficient according to a variation of the resistance ratio Rp/Rn is generated.

To solve this problem, in the embodiment, the following resistance circuit is provided.

FIG. 5 shows a resistance circuit as a reference resistor to which the present invention is applied.

The resistance circuit 9 according to the present invention includes a series circuit (first resistance circuit) Rs including a resistor (second resistive element) Rp1 having a positive resistance temperature coefficient and a resistor (first resistive element) Rn1 having a negative resistance temperature coefficient and a parallel circuit (second resistance circuit) Rc including a resistor (fourth resistive element) Rp2 having a positive resistance temperature coefficient and a resistor (third resistive element) Rn2 having a negative resistance temperature coefficient. The resistance circuit 9 constitutes the reference resistors 9a and 9b.

The resistor Rp1 and the resistor Rp2 are formed using the same resistive material and the same process. In addition, the resistor Rn1 and the resistor Rn2 are formed using the same resistive material and the same process. That is, a resistive thin film having a positive resistance temperature coefficient is etched, so that the resistor Rp1 and the resistor Rp2 are simultaneously patterned and formed. If a manufacturing variation occurs in a film thickness of the resistive thin film, the resistance value of the resistor Rp1 and the resistance value of the resistor Rp2 simultaneously vary, and a ratio (resistance ratio) between the resistance value of the resistor Rp1 and the resistance value of the resistor Rp2 is held. Likewise, the resistors Rn1 and Rn2 are simultaneously formed by etching a resistive thin film having a negative resistance temperature coefficient.

That is, in the embodiment, the resistor Rp1 and the resistor Rp2 are formed in a film of the same layer in a plurality of stacked layers by using the same process. In addition, the resistor Rn1 and the resistor Rn2 are formed in a film of the same layer in a plurality of stacked layers by using the same process.

If a resistance temperature coefficient of each of the resistors Rp1 and Rp2 is set to αp and a resistance temperature coefficient of each of the resistors Rn1 and Rn2 is set to −αn, a combined resistance Rs of the series circuit of the resistor Rn1 and the resistor Rp1 in the resistance circuit 9 becomes $$Rs = Rn1(1+\alpha n \cdot T) + Rp1(1-\alpha p \cdot T) \qquad (3).$$

In addition, a combined resistance Rc of the parallel circuit of the resistor Rn2 and the resistor Rp2 in the resistance circuit 9 becomes $$Rc = 1/(1/(Rn1(1+\alpha n \cdot T)) + 1/(Rp1(1-\alpha p \cdot T))) \qquad (4).$$

The resistance circuit 9 according to the embodiment is obtained by connecting the series circuit Rs and the parallel circuit Rc.

Hereinafter, functions and effects of the resistance circuit 9 according to the embodiment will be described.

Figure 6:
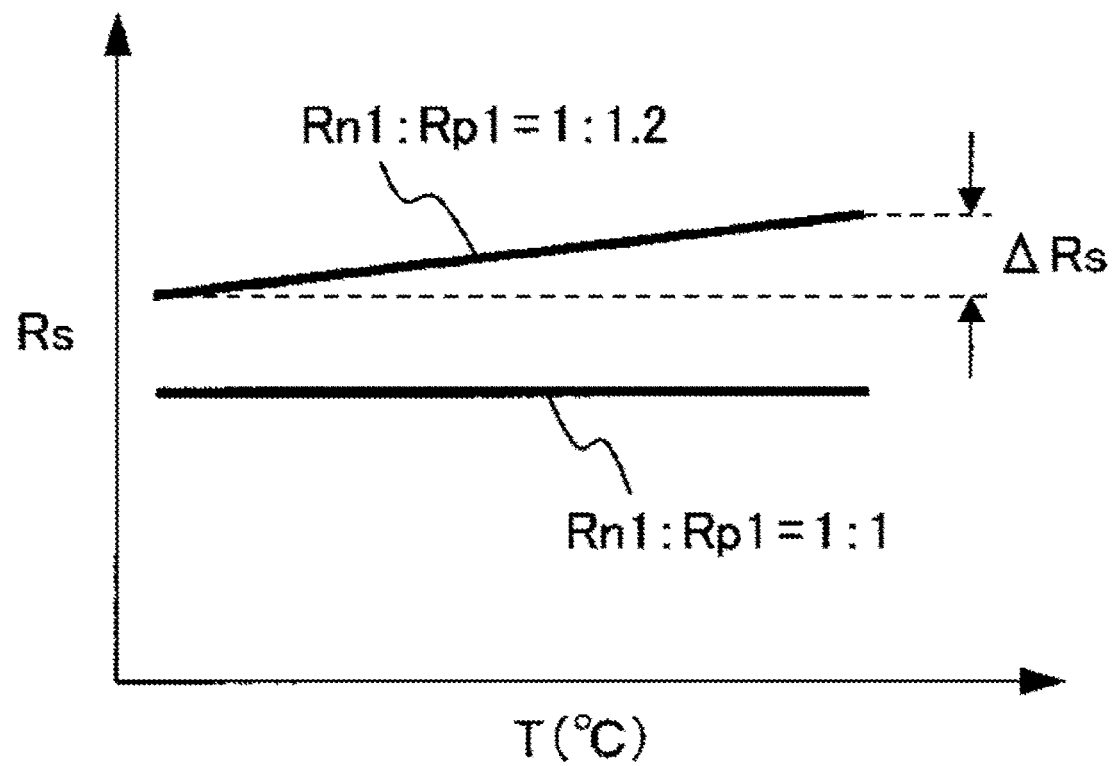
FIG. 6 is a diagram showing a function and an effect of a sensor device according to an embodiment of the present invention.

FIG. 6 shows temperature characteristics when a variation occurs in the resistance ratio between the resistor Rn1 and the resistor Rp1 in the combined resistance Rs of the series circuit unit. Here, an example of using resistive materials having characteristics in which the resistance temperature coefficient αn of the resistor Rn1 and the resistance temperature coefficient αp of the resistor Rp1 have the same absolute values, but have different signs is shown.

As shown in FIG. 6, when the resistance ratio between the resistor Rp1 and the resistor Rn1 is 1:1 as designed, a resistance change with temperature of the resistor Rn1 and a resistance change with temperature of the resistor Rp1 are offset and flat characteristics with respect to the temperature are obtained. Next, when Rp1 becomes 1.2 times due to a manufacturing variation, the overall combined resistance Rs shifts to a positive side. At the same time, an offset effect with respect to the temperature collapses and a resistance increase of ΔRs is caused by the temperature change.

Figure 7:
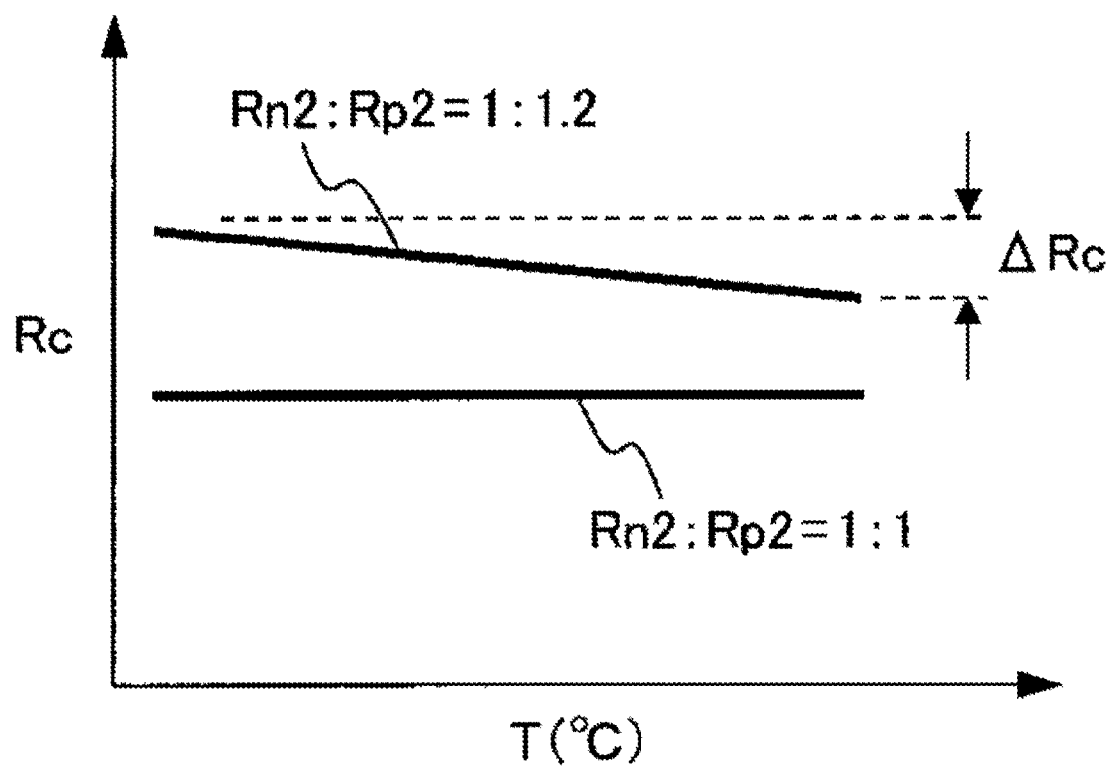
FIG. 7 is a diagram showing a function and an effect of a sensor device according to an embodiment of the present invention.

FIG. 7 shows temperature characteristics when a variation occurs in the resistance ratio between the resistor Rn2 and the resistor Rp2 in combined resistance Rc of the parallel circuit unit. Here, similar to the above, an example of using resistive materials having characteristics in which the resistance temperature coefficient αn of the resistor Rn2 and the resistance temperature coefficient αp of the resistor Rp2 have the same absolute values, but have different signs is shown.

As shown in FIG. 7, when the resistance ratio between the resistor Rp2 and the resistor Rn2 is 1:1 as designed, a resistance change with temperature of the resistor Rn2 and a resistance change with temperature of the resistor Rp2 are offset and flat characteristics with respect to the temperature are obtained. Next, when Rp2 becomes 1.2 times due to a manufacturing variation, the overall combined resistance Rc shifts to a positive side. At the same time, an offset effect with respect to the temperature collapses and a resistance decrease of ΔRc is caused by the temperature change.

In the series circuit Rs shown in FIG. 6 and the parallel circuit Rc shown in FIG. 7, the temperature dependencies generated by the high resistance of the materials (Rp1 and Rp2) having the positive resistance temperature coefficients are different in positive and negative. In the series circuit Rs, the temperature dependency of the resistor of the high resistance side in the two resistors appears. For this reason, if the resistance of Rp1 becomes a high resistance, a positive resistance change with temperature is generated. On the other hand, in the parallel circuit Rc, because the temperature dependency of the resistor of the low resistance side in the two resistors appears, conversely, a negative resistance change with temperature is generated. Therefore, in the series circuit Rs and the parallel circuit Rc, the temperature dependencies of the combined resistances Rs and Rc when the temperature change is generated are different in positive and negative.

If the combined resistance value (Rs) of the series circuit Rs and the combined resistance value (Rc) of the parallel circuit Rc are electrically connected in series, an effect of offsetting the resistance increase of the series circuit Rs and the resistance decrease of the parallel circuit Rc is obtained.

In the above example, the case of using the materials in which the absolute value of the resistance temperature coefficient αn of the resistors Rn1 and Rn2 and the absolute value of the resistance temperature coefficient αp of the resistors Rp1 and Rp2 are the same has been described. However, when the absolute value of the resistance temperature coefficient αn and the absolute value of the resistance temperature coefficient αp are different, the resistance ratio between the resistor Rn1 and the resistor Rp1 may be appropriately adjusted and the absolute value of the resistance temperature coefficient αn and the absolute value of the resistance temperature coefficient αp do not need to be the same.

Preferably, if the combined resistance value (Rs) of the series circuit Rs and the combined resistance value (Rc) of the parallel circuit Rc are designed to become substantially the same resistance values (Rs=Rc), ΔRs and ΔRc shown in FIGS. 6 and are more matched, so that the effect of offsetting the resistance change with temperatures generated by the resistance variations increases.

That is, the combined resistance value (Rs) of the series circuit Rs and the combined resistance value (Rc) of the parallel resistor Rc are substantially the same. Here, when the combined resistance value Rs and the combined resistance value Rc include an error due to processing variations or the like or a difference between the resistance values Rs and Rc intentionally created within a range where the object of the present invention can be achieved, the combined resistance value (Rs) and the combined resistance value (Rc) are considered to be substantially the same.

Figure 8:
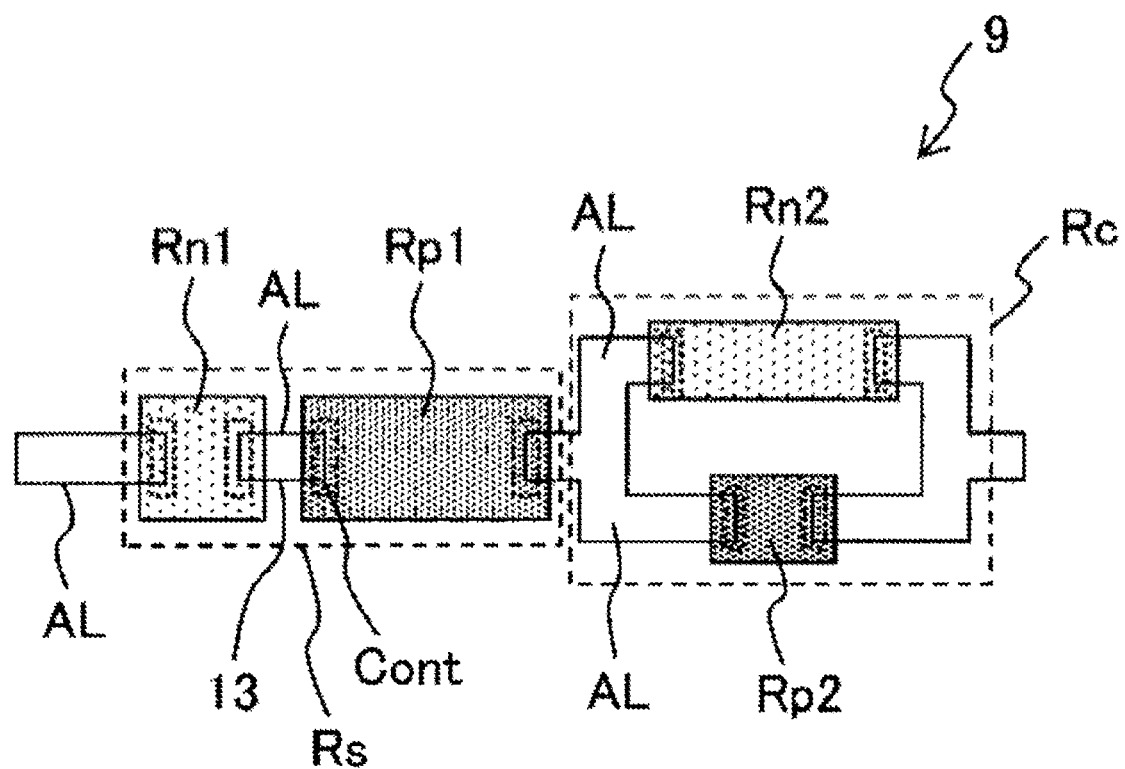
FIG. 8 is a plan view of a resistance circuit according to an embodiment of the present invention.
Figure 9:
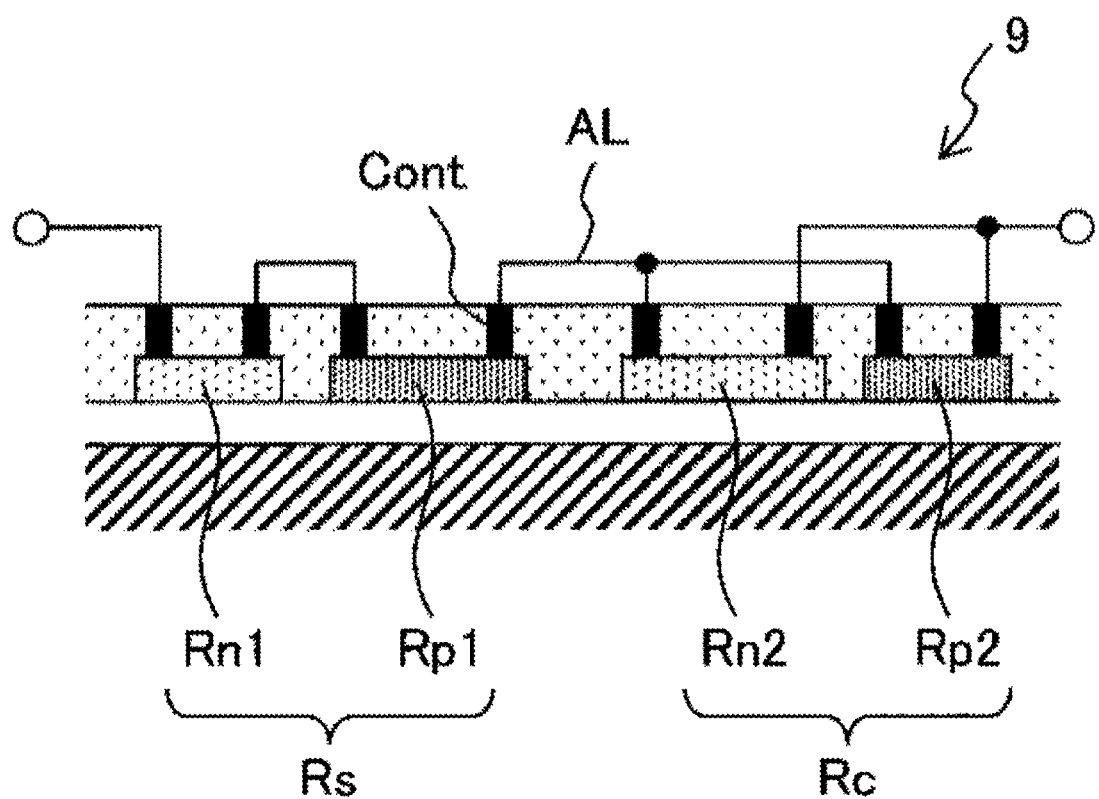
FIG. 9 is a cross-sectional view of the resistance circuit according to an embodiment of the present invention.

FIGS. 8 and 9 show specific structures of the resistance circuit 9 according to the embodiment. FIG. 8 shows a planar structure and FIG. 9 shows a cross-sectional structure.

The series circuit Rs including the polycrystalline silicon Rn1 having the negative resistance temperature coefficient and the polycrystalline silicon Rp1 having positive resistance temperature coefficient and the parallel circuit Rc including the polycrystalline silicon Rn2 having the negative resistance temperature coefficient and the Polycrystalline silicon Rp1 having the positive resistance temperature coefficient are electrically connected in series. Each resistor is connected by an aluminum wiring line AL and a contact Cont. The positive/negative of the resistance temperature coefficient of the polycrystalline silicon is determined by an impurity concentration.

As shown in the cross-sectional structure of FIG. 9, the resistor Rn1 and the resistor Rn2 are formed in the same layer by using the same process. In addition, the resistor Rp1 and the resistor Rp2 are formed in the same layer by using the same process. Since the resistor Rn1 and the resistor Rp1 or the resistor Rn2 and the resistor Rp2 have the different resistance temperature coefficients, they are formed by using different processes. In the drawing, although the resistor Rn1 and the resistor Rp1 are formed in the same layer, they may be formed in different layers. In addition, although the resistor Rn2 and the resistor Rp2 are formed in the same layer, they may be formed in different layers.

As the resistive materials, in addition to the polycrystalline silicon, a diffused resistor obtained by doping a silicon substrate with impurities can be used. As the diffused resistor obtained by doping the silicon substrate with the impurities, a silicide resistor or a metal resistor can be used. The polycrystalline silicon has a smaller resistivity variation than these resistive materials. Therefore, the resistance ratio between the resistor Rn1 and the resistor Rn2 and the resistance ratio between the resistor Rp1 and the resistor Rp2 can be more matched and the effect of the present invention can be increased.

Second Embodiment

Another embodiment of a reference resistor of a sensor element according to the present invention will be described.

In a sensor device I used in a harsh environment such as a vehicle engine, it is necessary to reduce an influence of a mechanical distortion in addition to a temperature change. If a distortion is applied to a semiconductor chip provided with a drive circuit 9, a resistance change by a piezo effect (hereinafter, referred to as the piezoresistance change) is generated in a resistor formed in the semiconductor chip. The mechanical distortion is generated by expansion and contraction of a support material on which the semiconductor chip is installed, in addition to expansion and thermal contraction of the semiconductor chip due to a temperature. Therefore, if an environment temperature at which the sensor device 1 is used changes, the piezoresistance change is generated, in addition to a resistance change with temperature.

The positive/negative of a piezoresistance coefficient of a semiconductor is different according to a conductivity type of silicon. For example, in N-type silicon doped with phosphorus as an impurity, if a tension is applied along a direction of a current flowing through the resistor, a resistance value decreases. In P-type silicon doped with boron as an impurity, conversely, the resistance value increases. Therefore, the resistance change due to the distortion of a reference resistor can be reduced by combing silicon materials of different conductivity types.

Figure 10:
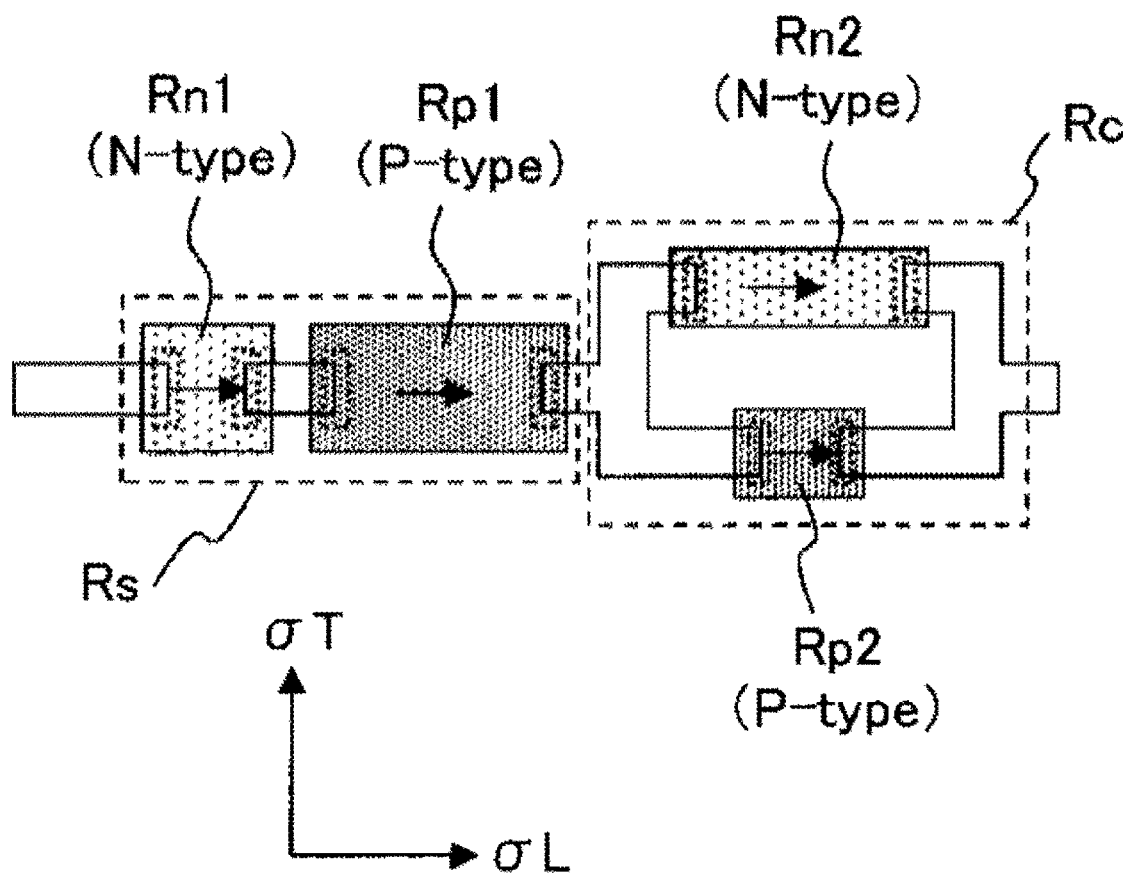
FIG. 10 is a plan view of a resistance circuit according to an embodiment of the present invention.

FIG. 10 shows a specific example of the reference resistor in which the piezoresistance change has been reduced.

N-type polycrystalline silicon is used in resistors Rn1 and Rn2 and P-type polycrystalline silicon is used in resistors Rp1 and Rp2. The other configuration is the same as the first embodiment.

If a stress σL is applied along the direction of the current flowing through the resistor, in a resistor Rn1 and a resistor Rp1 constituting a series circuit (first resistance circuit) Rs, a resistance value of the resistor Rn1 decreases and a resistance value of the resistor Rp1 increases. In addition, in a resistor Rn2 and a resistor Rp2 constituting a parallel circuit (second resistance circuit) Rc, a resistance value of the resistor Rn2 decreases and a resistance value of the resistor Rp2 increases.

If a stress σT is applied in a direction crossing the direction of the current flowing through the resistor, in the resistor Rn1 and the resistor Rp1 constituting the series circuit Rs, the resistance value of the resistor Rn1 increases and the resistance value of the resistor Rp1 decreases. In addition, in the resistor Rn2 and the resistor Rp2 constituting the parallel circuit Rc, the resistance value of the resistor Rn2 increases and the resistance value of the resistor Rp2 decreases.

In the configuration described above, by combining the resistors of the different conductivity types, when the stress σL or the stress σT is applied, the piezoresistance change of the resistor Rn1 and the piezoresistance change of the resistor Rp1 cancel each other and the piezoresistance change of the resistor Rn2 and the piezoresistance change of the resistor Rp2 cancel each other. Therefore, in this embodiment, the influence of the piezoresistance change due to the stress σL and the stress σT is suppressed and a change in the combined resistance value of the resistance circuit 9 is suppressed.

The resistance circuit 9 according to the embodiment has the series circuit Rs and the parallel circuit Rc, similar to the first embodiment, and has the same functions and effects as the first embodiment.

Third Embodiment

Figure 11:
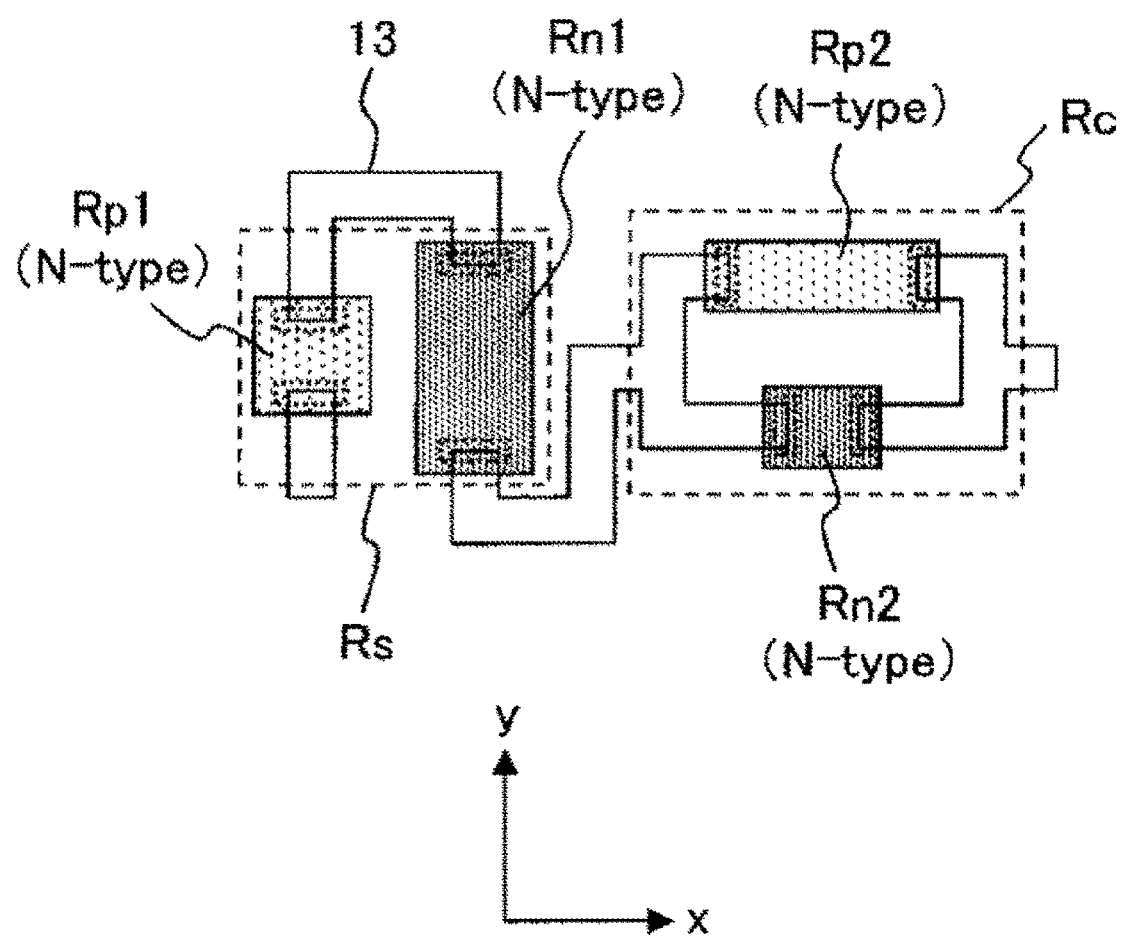
FIG. 11 is a plan view of a resistance circuit according to an embodiment of the present invention.

FIG. 11 shows another specific example of a reference resistor in which a piezoresistance change has been reduced.

All resistors Rn1, Rn2, Rp1, and Rp2 use N-type polycrystalline silicon of the same conductivity type. In addition, patterning is performed such that a direction (y direction) of a current flowing through the resistors Rn1 and Rp1 constituting a series circuit Rs and a direction (x direction) of a current flowing through the resistors Rn2 and Rp2 constituting a parallel circuit Rc are orthogonal to each other. The other configuration is the same as the first and second embodiments.

In the above structure, if a stress is applied in the x direction in the drawing, resistance values of the resistors Rn1 and Rp1 increase and resistance values of the resistors Rn2 and Rp2 decrease. As such, the resistors Rn1 and Rp1 and the resistors Rn2 and Rp2 of the same conductivity type are arranged such that the current directions are orthogonal to each other. As a result, resistance changes of the resistors Rn1 and Rp1 and the resistors Rn2 and Rp2 cancel each other.

For this reason, in this embodiment, the arrangement of the resistor Rn1 and the resistor Rp1 constituting the series circuit Rs is different from those of the first and second embodiments. That is, a wiring line 13 to connect the resistor Rn1 and the resistor Rp1 is folded back and the direction of the current flowing through the resistor Rn1 and the direction of the current flowing through the resistor Rp1 are parallel and are different by 180 degrees.

In other words, in the embodiment, the first resistive element Rn1, the second resistive element Rp1, the third resistive element Rn2, and the fourth resistive element Rp2 are arranged such that the direction of the current flowing through the first resistive element Rn1 and the second resistive element Rn2 constituting the first resistance circuit Rs and the direction of the current flowing through the third resistive element Rn2 and the fourth resistive element Rp2 constituting the second resistance circuit Rc are orthogonal to each other.

In the first embodiment, the wiring line 13 (refer to FIG. 8) to connect the resistor Rn1 and the resistor Rp1 is linearly formed. However, when a piezoresistance change can be ignored, the wiring line 13 shown in FIG. 8 may be folded back as shown in FIG. 11.

As described above, a change in the reference resistor due to the distortion caused by the environment temperature change can be reduced by the configuration in which the resistors Rn1, Rp1, Rn2, and Rp2 constituting the reference resistor are formed by combining the resistors (N-type resistors) Rn1 and Rn2 and the resistors (P-type resistors) Rp1 and Rp2 of the different conductivity types or by the configuration in which the resistors Rn1 and Rp1 and the resistors Rn2 and Rp2 of the same conductivity type are combined such that the directions of the flowing currents are different by 90 degrees.

In each of the embodiments described above, configuration in which the series resistor Rs (Rn1 and Rp1) and the parallel resistor Rc (Rn2 and Rp2) are connected in series is shown. However, the same effects can be obtained even in a configuration in which these are connected in parallel.

The present invention is not limited to the embodiments described above and various modifications are included. For example, the embodiments are described in detail to facilitate the description of the present invention, and the present invention is not limited to the device including the full configurations. In addition, a part of the configurations of the certain embodiment can be replaced by the configurations of other embodiments or the configurations of other embodiments can be added to the configurations of the certain embodiment. In addition, a part of the configurations of the individual embodiments may be removed, or be added or replaced with other configurations.

REFERENCE SIGNS LIST 1 sensor element
2 substrate
3 detection heater
4 compensation heater
5 cavity portion
6 thin film support
7a to 7d electrode
8a, 8b insulating layer
9a, 9b reference resistor
10a, 10b resistor
11a, 11b resistor
12a, 12b differential amplifier
13 wiring line
30 drive circuit
30A bridge circuit including detection heater 3
30B bridge circuit including compensation heater 4
Rc parallel circuit
Rn1, Rp1 resistor configuring series circuit Rs
Rn2, Rp2 resistor configuring parallel circuit Rc
Rs series circuit

The invention claimed is:

1. A sensor device that includes a detection resistor having a resistance value changing according to a physical quantity and a reference resistor compared with the detection resistor and that measures the physical quantity on the basis of a change in the resistance value of the detection resistor, wherein the reference resistor is configured by electrically connecting a first resistance circuit and a second resistance circuit, the first resistance circuit including a first resistive element having a positive resistance temperature coefficient and a second resistive element having a negative resistance temperature coefficient that are electrically connected, the second resistance circuit including a third resistive element having a positive resistance temperature coefficient and a fourth resistive element having a negative resistance temperature coefficient that are electrically connected, the first resistance circuit is configured such that a combined resistance value generates a first deviation to either the positive or negative side with respect to a temperature change, and the second resistance circuit is configured such that a combined resistance value generates a second deviation to the side opposite to the positive or negative side where the first deviation is generated, with respect to the temperature change.

2. The sensor device according to claim 1, wherein the first resistance circuit comprises a series circuit in which the first resistive element and the second resistive element are connected in series, and the second resistance circuit comprises a parallel circuit in which the third resistance element and the fourth resistance element are connected in parallel.

3. The sensor device according to claim 2, wherein the first resistive element and the third resistive element are formed of a polycrystalline silicon film of the same layer and the second resistive element and the fourth resistive element are formed of a polycrystalline silicon film of the same layer.

4. The sensor device according to claim 3, wherein the reference resistor is configured such that a combined resistance value of the series circuit and a combined resistance value of the parallel circuit are substantially the same.

5. The sensor device according to claim 3, wherein the first resistive element and the third resistive element are polycrystalline silicon doped with impurities of the same conductivity type and the third resistive element and the fourth resistive element are polycrystalline silicon doped with impurities of a conductivity type different from the conductivity type of the first resistive element and the second resistive element.

6. The sensor device according to claim 3, wherein the first resistive element, the second resistive element, the third resistive element, and the fourth resistive element are polycrystalline silicon doped with impurities of the same conductivity type, and the first resistive element, the second resistive element, the third resistive element, and the fourth resistive element are arranged such that a direction of a current flowing through the first resistive element and the second resistive element constituting the first resistance circuit and a direction of a current flowing through the third resistive element and the fourth resistive element constituting the second resistance circuit are orthogonal to each other.

* * * * *